United States Patent [19]

Bouley et al.

[11] 4,442,446

[45] Apr. 10, 1984

[54] SENSITIZED EPITAXIAL INFRARED DETECTOR

[75] Inventors: Alan C. Bouley, Silver Spring; Harold R. Riedl, Adelphi; James D. Jensen, Highland, all of Md.; Steven R. Jost, Baldwinsville, N.Y.

[73] Assignee: The United States of America as represented by the Secretary of the Navy, Washington, D.C.

[21] Appl. No.: 358,941

[22] Filed: Mar. 17, 1982

[51] Int. Cl.³ .................... H01L 27/14; H01L 33/00; H01L 29/167; H01L 23/48
[52] U.S. Cl. ........................................ 357/30; 357/63; 357/67; 357/61
[58] Field of Search ...................... 357/30, 17, 67, 63, 357/30 C, 30 B, 30 F, 61

[56] References Cited

U.S. PATENT DOCUMENTS

| | | | |
|---|---|---|---|
| 3,484,312 | 12/1969 | Ermanis et al. | 357/67 |
| 3,598,760 | 8/1971 | Nakamura et al. | 357/63 |
| 3,599,058 | 8/1971 | Schillman et al. | 357/63 |
| 3,716,424 | 2/1973 | Schoolar | 357/17 |
| 3,780,427 | 12/1973 | Jenkins et al. | 357/67 |
| 4,004,342 | 1/1977 | Park et al. | 357/63 |
| 4,080,723 | 3/1978 | Holloway | 357/30 |
| 4,156,631 | 5/1979 | Schoolar | 202/192 |
| 4,227,948 | 10/1980 | Jensen et al. | 357/30 |
| 4,243,885 | 1/1981 | Agouridis et al. | 357/30 |
| 4,263,604 | 4/1981 | Jensen et al. | 357/30 |
| 4,312,114 | 1/1982 | Schoolar | 357/30 |
| 4,339,764 | 7/1982 | Schoolar | 357/30 |
| 4,371,232 | 2/1983 | Jensen et al. | 357/30 |

Primary Examiner—Martin H. Edlow
Assistant Examiner—Jerome Jackson
Attorney, Agent, or Firm—R. F. Beers; K. E. Walden; R. D. Johnson

[57] ABSTRACT

An infrared sensitive photodiode which is made of an epitaxial layer of a semiconductor alloy which is a lead chalcogenide, a lead-tin chalcogenide, or a lead-cadmium chalcogenide grown on a single crystal substrate of an infrared transparent, electrically insulating material, an Ohmic contact deposited on the epitaxial layer, and a non-Ohmic Pb metal contact deposited on the epitaxial layer to form a Schottky barrier, the improvement comprising the inclusion of halide ions in the interface region between the non-Ohmic lead metal contact and the epitaxial layer of semiconductor material.

4 Claims, 1 Drawing Figure

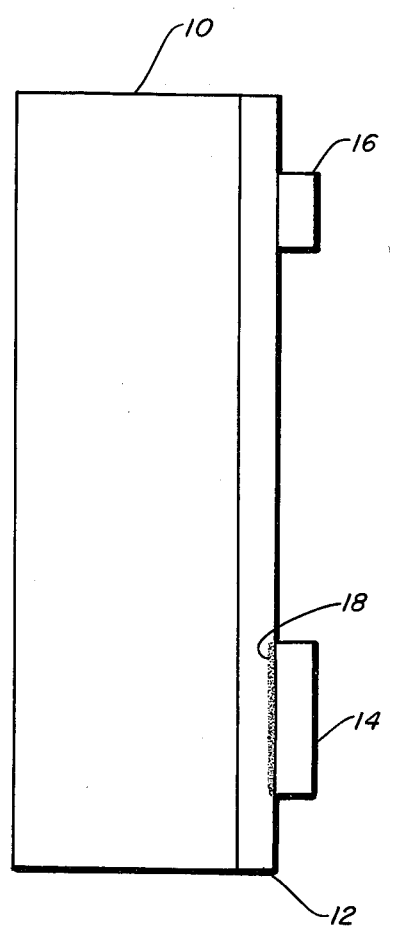

SENSITIZED EPITAXIAL INFRARED DETECTOR

BACKGROUND OF THE INVENTION

This invention relates to photodetectors and more particularly to infrared-sensitive photodiodes.

It is well established that single crystal films of lead chalcogenides, lead-tin chalcogenides, and lead-cadmium chalcogenides can be epitaxially grown on heated alkali halide and alkaline earth halide substrates by vacuum evaporation. The chalcogenides used include the sulfides, selenides, tellurides, and mixtures thereof. The substrates are single crystals of infrared transparent alkali halides and alkaline earth halides. Examples include barium fluoride, strontium fluoride, calcium fluoride, lithium fluoride, sodium chloride, potassium chloride, etc.

It is also well known that the vacuum deposition of a metallic contact of certain materials such as lead or indium, on the surface of an epitaxial layer of lead chalcogenide, lead-tin chalcogenide, or lead-cadmium chalcogenide creates a non-Ohmic Schottky barrier at the point of contact, resulting in an infrared sensitive photodiode. Vacuum depositing a contact of certain other metals (e.g., Au, Ni, Pb, or Pt) at another point on the epitaxial layer provides the Ohmic contact necessary for measuring the photovoltage of the device.

Attention is called to U.S. Pat. No. 4,263,604, entitled "Graded Gap Semiconductor Detector," issued on Apr. 21, 1981 to James D. Jensen and Richard B. Schoolar wherein an extensive biography of articles and patents dealing with these Schottky barrier devices is listed in the background of the invention.

Despite the usefulness of these prior art devices and processes, there are two areas where improvement would be desirable. First, it would be desirable to improve the reliability of fabrication of these devices and second, it would be desirable to increase the performance of these devices.

SUMMARY OF THE INVENTION

Accordingly, an objective of this invention is to provide an improved Schottky barrier device.

Yet another objective of this invention is to provide a more sensitive Schottky barrier device.

A still further objective of this invention is to provide a process of producing Schottky barrier devices which will result in fewer of the devices being rejected due to poor sensitivity.

These and other objects of this invention are accomplished by providing:

In an infrared sensitive diode comprising:

(1) an infrared transparent, electrically insulating, single crystal substrate composed of a material selected from the group consisting of (a) alkali halides and (b) alkaline earth halides;

(2) an epitaxial layer of a semiconductor alloy material which is a lead chalcogenide, a lead-tin chalcogenide, or a lead-cadmium chalcogenide wherein the epitaxial layer of semiconductor material covers at least a portion of the substrate;

(3) a non-Ohmic Pb metal contact deposited on a portion of the epitaxial layer to form a Schottky barrier junction; and (4) an Ohmic contact deposited on a different portion of the epitaxial layer of the semiconductor material;

the improvement comprising the inclusion of halide ions selected from the group consisting of chloride ions, bromide ions, fluoride ions, and mixtures thereof at the interface region between the non-Ohmic Pb metal contact and the epitaxial layer of semiconductor material.

The invention also includes a method of producing the improved infrared sensitive photodiode.

BRIEF DESCRIPTION OF THE DRAWING

A more complete appreciation of this invention and many of the attendant advantages thereof will be readily appreciated as the same becomes better understood by reference to the following detailed description when considered in connection with the accompanying drawing:

The FIGURE is a schematic representation of a cross-sectional side view of the infrared sensitive Schottky barrier diode of this invention.

DETAILED DESCRIPTION OF THE PREFERRED EMBODIMENT

It has now been discovered that the presence of halogen ions in the zone or region between an epitaxial layer of a II-IV-VI semiconductor alloy and a non-Ohmic Pb contact (i.e., Schottky barrier forming means) of certain prior art infrared sensitive photodiodes substantially enhances the performance of those photodiodes. The FIGURE schematically represents a cross-sectional side view of the device. A single crystal thin film of semiconductor material 12 is epitaxially grown by vacuum deposition onto an infrared transparent single crystal substrate 10. An Ohmic contact 16 and a non-Ohmic contact 14 are each vacuum deposited onto the semiconductor thin film 12 by conventional means. The halogen ions present on and extending a short distance into the epitaxial semiconductor film 12 at the region of contact 18 between the non-Ohmic Pb contact 14 and the epitaxial layer of semiconductor alloy 12 is the novel feature of the present invention.

Suitable substrate 10 materials must be infrared transparent and electrically insulating. Single crystals of alkali halides (e.g., KCl, NaCl, KBr) and alkaline earth halides (e.g., $BaF_2$, $SrF_2$, $Ba_wSr_{1-w}F_2$ with $0<w<1$) have previously been found to be suitable. However, certain of the compounds (e.g., NaCl, KCl) are less preferred or even unsuitable because they are hygroscopic. In conclusion those substrate 10 materials which are suitable for use in the cited prior art infrared sensitive photodiodes are also suitable for the photodiodes of the present invention.

The epitaxial layer of semiconductor material 12 is produced by the vacuum deposition of a lead chalcogenide, lead-tin chalcogenide, or lead-cadmium chalcogenide onto the heated substrate 10. The chalcogenides used include sulfides, selenides, tellurides, and mixtures thereof. More specifically, some of the materials which may be used are represented by the following formulas: PbS, PbSe, PbTe, $PbS_xSe_{1-x}$, $PbS_xTe_{1-x}$, $PbSe_xTe_{1-x}$, $Pb_ySn_{1-y}S$, $Pb_ySn_{1-y}Se$, $Pb_ySn_{1-y}Te$, $Pb_ySn_{1-y}S_xSe_{1-x}$, $Pb_ySn_{1-y}S_xTe_{1-x}$, $Pb_ySn_{1-y}Se_xTe_{1-y}$, $Pb_zCd_{1-z}S$, $Pb_zCd_{1-z}Se$, $Pb_zCd_{1-z}Te$, $Pb_zCd_{1-z}S_xSe_{1-x}$, $Pb_zCd_{1-z}S_xTe_{1-x}$, and $Pb_zCd_{1-z}Se_xTe_{1-x}$, wherein $0<x<1$, $0<y<1$, and $0<z<1$, and preferably $0.9<y<1$ and $0.8<z<1$ Preferred among these materials are the lead chalogenides: PbS, PbSe, PbTe, $PbS_xSe_{1-x}$, and $PbSe_{1-x}Te_{1-x}$ wherein $0<x<1$.

The epitaxial layer of semiconductor alloy material 12 is grown on the substrate by conventional vacuum deposition techniques. Examples of these techniques are disclosed in U.S. Pat. No. 3,716,424, entitled "Method of Preparation of Lead Sulfide PN Junction Diodes", which was issued to Richard B. Schoolar on Feb. 13, 1973 and U.S. Pat. No. 4,156,631, entitled "Equilibrium Growth Techniques for Preparing $PbS_xSe_{1-x}$ Epilayers," which was issued to Richard B. Schoolar on May 15, 1979, herein incorporated by reference.

After the epitaxial layer of semiconductor alloy has been deposited, and prior to the lead (Pb) metal deposition, the epitaxial layer is annealed at about 170° C. for about 30 minutes in vacuum to desorb oxygen on its surface. The semiconductor is then cooled to room temperature.

Conventionally, a Schottky barrier is next formed by vacuum depositing a dot or strip of lead onto a portion of the epitaxial layer of semiconductor alloy to form a non-Ohmic contact 14. This step is performed with the lead (Pb) evaporation source at a temperature of about 1200° C. or more and under a vacuum of at least $10^{-5}$ torr and preferable $10^{-6}$ torr. This process takes about 10 minutes.

The present invention involves a modification of this last step. A lead halogen compound which may be $PbCl_2$, $PbBr_2$, $PbF_2$, or mixtures thereof is added to the lead (Pb) for this vapor deposition step. As a result, the non-Ohmic lead (Pb) contact 14 will contain chloride, bromide, or fluoride ions or mixtures thereof. Although these ions are present throughout the lead (Pb) dot or strip, it is the halide ions present in the zone at contact 18 between the epitaxial layer of semiconductor alloy 12 and the non-Ohmic contact 14 which improves the sensitivity of the device. It appears that the halide ions may extend as far as 20 Å into the epitaxial layer of semiconductor alloy. Note that $PbCl_2$, because of its relatively low toxicity is the preferred additive.

In the vacuum deposition step to produce the non-Ohmic lead metal contact, the exact amount of lead halide present is not critical so long as there is a sufficient amount present to provide lead halide vapor throughout this step and not so much as to interfere with the vaporization of the lead metal. The amount of lead halide used can be substantially less than the amount of lead metal.

An Ohmic contact 16 is then formed on another portion of the epitaxial layer of semiconductor alloy by the convention vacuum deposition of a metal such as Au, Ni, Pd, or Pt.

The general nature of the invention having been set forth, the following examples are presented as specific illustrations thereof. It will be understood that the invention is not limited to these specific examples, but is susceptible to various modifications that will be recognized by one of ordinary skill in the art.

The performance of an infrared detector is characterized by its detectivity, $D^*$, in cm $Hz^{\frac{1}{2}}$/W. The following values of $D^*$ were measured on detectors of both PbTe and $PbS_{0.5}Se_{0.5}$ semiconductor alloy. Included in this table are $D^*$ values for both prior art unsensitized detectors as well as for detectors sensitized with $PbCl_2$ in the manner described in this invention. These values are representative of the improvement in performance provided by this invention.

| Detector Semiconductor Alloy | Sensitized with $PbCl_2$? | $D^*$ @ 300° K. | $D^*$ @ 77° K. |
| --- | --- | --- | --- |
| PbTe | Yes | $1.3 \times 10^9$ | $1.7 \times 10^{11}$ |
| PbTe | No | $1.2 \times 10^8$ | $3.1 \times 10^{10}$ |
| $PbS_{.5}Se_{.5}$ | Yes | $2.1 \times 10^9$ | $1.1 \times 10^{11}$ |
| $PbS_{.5}Se_{.5}$ | No | $6.2 \times 10^8$ | $1.2 \times 10^{10}$ |

Obviously, numerous modifications and variations of the present invention are possible in light of the above teachings. It is therefore to be understood that within the scope of the appended claims the invention may be practiced otherwise than as specifically described herein.

What is claimed as new and desired to be secured by Letters Patent of the United States is:

1. In an infrared sensitive diode comprising:
    (1) an infrared transparent, electrically insulating single crystal substrate composed of a material selected from the group consisting of (a) akali halides and (b) alkaline earth halides;
    (2) an epitaxial layer of a semiconductor alloy material selected from the grup consisting of PbS, PbSe, PbTe, $PbS_xSe_{1-x}$, $PbS_xTe_{1-x}$, $PbSe_xTe_{1-x}$, $Pb_ySn_{1-y}S$, $Pb_ySn_{1-y}Se$, $Pb_ySn_{1-y}Te$, $Pb_ySn_{1-y}S_xSe_{1-x}$, $Pb_ySn_{1-y}S_xTe_{1-x}$, $Pb_ySn_{1-y}Se_xTe_{1-x}$, $Pb_zCd_{1-z}S$, $Pb_zCd_{1-z}Se$, $Pb_zCd_{1-z}Te$, $Pb_zCd_{1-z}S_xSe_{1-x}$, $Pb_zCd_{1-z}S_xTe_{1-x}$, and $Pb_zCd_{1-z}Se_xTe_{1-x}$, wherein $0<x<1$, $0<y<1$ and $0<z<1$, wherein the epitaxial layer of semiconductor material covers at least a portion of the substrate;
    (3) a non-Ohmic Pb metal contact deposited on the epitaxial layer to form a Schottky barrier junction; and
    (4) an Ohmic contact deposited on the epitaxial layer of the semiconductor material;
    the improvement comprising: the inclusion of halide ions selected from the group consisting of chloride ions, bromide ions, fluoride ions, and mixtures thereof at the interface between the non-Ohmic Pb metal contact and the epitaxial layer of semiconductor alloy material.

2. The infrared sensitive photodiode of claim 1 wherein the epitaxial semiconductor alloy material is selected from the group consisting of PbS, PbSe, PbTe, $PbS_xSe_{1-x}$, and $PbSe_xTe_{1-x}$ wherein $0<x<1$.

3. The infrared sensitive diode of claim 1 wherein $0.90<y<1$ and $0.80<z<1$.

4. The infrared sensitive diode of claim 1, 2, or 3 wherein halide ions are chloride ions.

* * * * *